(12) United States Patent
Asada et al.

(10) Patent No.: US 8,039,107 B2
(45) Date of Patent: Oct. 18, 2011

(54) SILVER-COATED BALL AND METHOD FOR MANUFACTURING SAME

(75) Inventors: Ken Asada, Suita (JP); Fumiaki Kikui, Suita (JP)

(73) Assignee: Neomax Materials Co., Ltd., Suita-Shi, Osaka (JP)

( * ) Notice: Subject to any disclaimer, the term of this patent is extended or adjusted under 35 U.S.C. 154(b) by 921 days.

(21) Appl. No.: 11/915,659

(22) PCT Filed: May 23, 2006

(86) PCT No.: PCT/JP2006/310227
§ 371 (c)(1),
(2), (4) Date: Nov. 27, 2007

(87) PCT Pub. No.: WO2006/126527
PCT Pub. Date: Nov. 30, 2006

(65) Prior Publication Data
US 2009/0286099 A1    Nov. 19, 2009

(30) Foreign Application Priority Data

May 27, 2005    (JP) .................................. 2005-156226

(51) Int. Cl.
B32B 15/02    (2006.01)
B22B 1/02    (2006.01)
(52) U.S. Cl. ........................................ 428/403; 428/570
(58) Field of Classification Search ........................ None
See application file for complete search history.

(56) References Cited

U.S. PATENT DOCUMENTS

| 4,775,598 A * | 10/1988 | Jaeckel .......................... 428/550 |
| 5,847,929 A | 12/1998 | Bernier et al. |
| 2004/0139820 A1 * | 7/2004 | Kodas et al. ...................... 75/252 |
| 2005/0183543 A1 * | 8/2005 | Sasaki et al. ...................... 75/371 |
| 2006/0055054 A1 | 3/2006 | Kondo et al. |

FOREIGN PATENT DOCUMENTS

| GB | 1 370 253 | 10/1974 |
| JP | 10-70141 | 3/1998 |
| JP | 2000-248303 | 9/2000 |
| JP | 2003-159525 | 6/2003 |
| JP | 2005-060831 | 3/2005 |
| WO | WO 03/040270 A2 | 5/2003 |
| WO | WO 03/040270 A3 | 5/2003 |
| WO | WO 2004/030428 A1 | 4/2004 |

OTHER PUBLICATIONS

International Search Report, PCT/JP2006/310227 dated Aug. 8, 2006.*
International Preliminary Report for International Appln. No. PCT/JP2006/310227 mailed Dec. 13, 2007.
Extended European Search Report (Application No. PCT/EP06756483.1) dated May 3, 2010.

* cited by examiner

*Primary Examiner* — Jennifer McNeil
*Assistant Examiner* — Adam Krupicka
(74) *Attorney, Agent, or Firm* — Nixon Peabody LLP; Jeffrey L. Costellia (57) ABSTRACT

A silver-coated ball 10 according to the present invention includes: a spherical core 1; and a coating layer 2 including silver superfine particles, which is arranged so as to surround the core 1. The silver superfine particles included in the coating layer 2 have a mean particle size of 1 nm to 50 nm.

3 Claims, 5 Drawing Sheets 1.2mm

SILVER-COATED BALL AND METHOD FOR MANUFACTURING SAME

TECHNICAL FIELD

The present invention relates to a silver-coated ball, and more particularly relates to a silver-coated ball in which the surface of the core is covered with a coating layer including silver superfine particles with a mean particle size of 1 nm to 50 nm.

BACKGROUND ART

Solder balls are mainly used to connect a number of electric/electronic components together. Specifically, solder balls are used as input/output terminals for a quad flatpack package (QFP) with lead terminals around its components and semiconductor packages such as a ball grid array (BGA) and a chip size package (CSP), which are relatively small in size and which can cope with multiple-pin applications.

Figure 10:
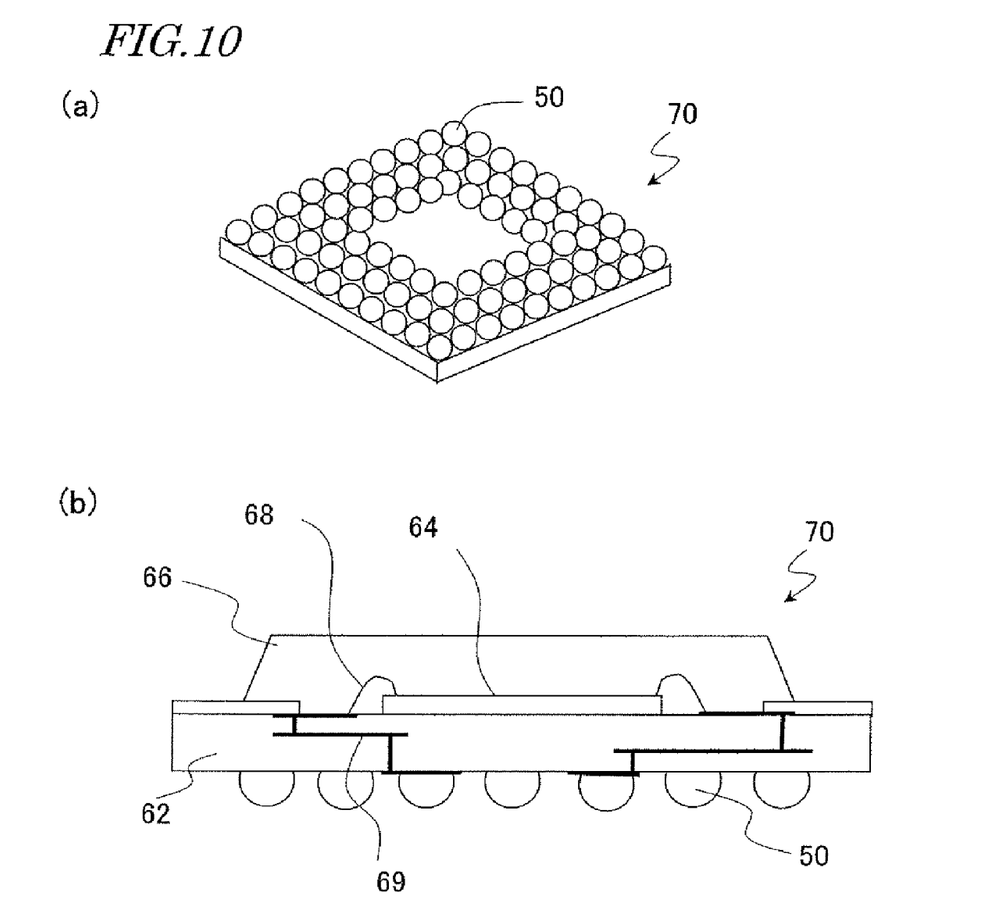
FIGS. 10(a) and 10(b) are respectively a perspective view and a cross-sectional view illustrating a BGA that uses solder balls.

FIGS. 10(a) and 10(b) are respectively a perspective view and a cross-sectional view of a BGA that uses solder balls. As shown in FIGS. 10(a) and 10(b), a BGA is an LSI package in which silver-coated balls 50 are bonded onto the lower surface of an LSI chip with an interposer 62 interposed between them. The silver-coated balls 50 are arranged in matrix on one side of the interposer 62, and are used as input/output terminals for the package. Each of these silver-coated balls 50 is a tiny metallic sphere with a diameter of about 0.1 mm to about 1.0 mm, and may be obtained by forming a solder layer, including lead (Pb), on the surface of the metallic ball, for example.

In recent years, solder including lead is being replaced with solder including no lead (which is also called "Pb-free solder") in order to handle environmental issues. In view of these circumstances, the applicant of the present application disclosed a solder ball, of which the surface is coated with a tin-silver (Sn-AG) based solder layer with no lead and in which the creation of voids is minimized even when being heated and melted (see Patent Documents Nos. 1 and 2).

In general, solders are roughly classifiable, according to their soldering temperature, into medium-low temperature solders with melting temperatures of approximately 150° C. to approximately 250° C. and high-temperature solders with melting temperatures of approximately 250° C. to approximately 300° C. The medium-low temperature solder is mostly used to connect an electronic component onto a printed circuit board, while the high-temperature solder is often used to connect the interconnects of an electronic component together.

The Sn—Ag based solder layer mentioned above has a melting point of approximately 216° C., and therefore, solder balls with this solder layer can be used effectively in a soldering process at a medium to low temperature. In a high temperature range of about 250° C. to about 300° C., however, the Sn—Ag based solder layer would melt again to deform the balls, for example. For that reason, the Sn—Ag based solder layer cannot be used for a high-temperature soldering process. That is why a lead-free solder ball applicable to such a high-temperature soldering process is now in high demand.

Meanwhile, it is known that a metal in the form of nanoparticles (i.e., superfine particles with particle sizes of several nm to several hundreds of nm) has physical properties that are quite different from those of the same metal in bulk. For example, it is known that silver nanoparticles get sintered at a far lower temperature than silver in bulk. As for silver nanoparticles, Patent Document No. 3 discloses a method of making a silver colloid organosol including silver nanoparticles with a mean particle size of approximately 32 nm (see Examples of Patent Document No. 3).

Patent Document No. 1: Japanese Patent Application Laid-Open Publication No. 2004-114123
Patent Document No. 2: Japanese Patent Application Laid-Open Publication No. 2004-128262
Patent Document No. 3: Japanese Patent Application Laid-Open Publication No. 2003-159525

DISCLOSURE OF INVENTION

Problems to be Solved by the Invention

The present inventors carried out experiments to explore the possibility of using silver nanoparticles as a high-temperature solder material for solder balls.

A primary object of the present invention is to provide a silver-coated ball including a coating layer of silver nanoparticles and a method of making such a ball.

Means for Solving the Problems

A silver-coated ball according to the present invention includes: a spherical core; and a coating layer including silver superfine particles, which is arranged so as to surround the core. The silver superfine particles included in the coating layer have a mean particle size of 1 nm to 50 nm.

In one preferred embodiment, the silver-coated ball has 0.01 mass % to 1 mass % of carbon.

In another preferred embodiment, the coating layer has a thickness of 0.1 μm to 50 μm.

In another preferred embodiment, the core is made of copper or resin.

In another preferred embodiment, the core has a mean particle size of 0.05 mm to 1.5 mm.

A method of making a silver-coated ball according to the present invention includes the steps of: providing a dispersion including a spherical core, silver superfine particles, and a solvent; forming a film of the dispersion on the surface of the core; and removing the solvent of the dispersion from the film of the dispersion, thereby forming a coating layer, including the silver superfine particles, on the surface of the core. The silver superfine particles have a mean particle size of 1 nm to 50 nm. The solvent includes a nonpolar hydrocarbon solvent. And the ratio in mass percentage of the silver superfine particles to the solvent is 40-85 mass % to 15-60 mass %.

In one preferred embodiment, the step of forming the film of the dispersion on the surface of the core includes immersing the core in the dispersion.

In another preferred embodiment, the step of forming the coating layer including the silver superfine particles includes putting the ball, on which the film of the dispersion has been formed, on a slope and rolling the ball on the slope.

In another preferred embodiment, the solvent includes a solvent with a boiling point higher than about 100° C. and a solvent with a boiling point that is equal to or lower than about 10° C.

In another preferred embodiment, the nonpolar hydrocarbon solvent includes xylene.

EFFECTS OF THE INVENTION

In the silver-coated ball of the present invention, its spherical core is covered with a coating layer including silver superfine particles with a mean particle size of about 1 nm to about 50 nm. These silver superfine particles have a melting point of about 250° C. to about 300° C. That is why the silver-coated ball of the present invention can be used as a lead-free solder material in a high-temperature soldering process. Once melted as a result of the soldering process, the silver never melts again until the temperature reaches the melting point of silver at about 960° C. Consequently, the present invention provides a semiconductor package, of which the bonding strength with the silver-coated balls can be increased at high temperatures.

DESCRIPTION OF THE REFERENCE NUMERALS 1 core
2 coating layer
4A molten solder layer
10 silver-coated ball
12 Cu layer
14 Ni plating layer
16 Au plating layer
18 pad
20 substrate
31 slope
32 base
50 silver-coated ball
62 interposer

BEST MODE FOR CARRYING OUT THE INVENTION

To provide a silver-coated ball of which the surface of the core is uniformly covered with a coating layer including silver superfine particles (which will be sometimes referred to herein as a "silver coating layer"), the present inventors carries out experiments with special attention paid to a dispersion of silver superfine particles.

Generally speaking, silver superfine particles have such high surface activity as to coagulate together easily at room temperature. That is why the composition of the dispersion is appropriately controlled according to the intended application, for example, such that silver superfine particles with a desired particle size distribution do not coagulate together, but can keep chemically stabilized, in the dispersion. The dispersion usually includes a solvent to dissolve the silver superfine particles and a surfactant and may further include a deoxidizer and a protective colloid agent as needed.

For example, Patent Document No. 3 cited above discloses a composite gel in which a noble metal compound such as silver superfine particles and a surfactant are mixed together at a predetermined ratio. This composite gel can be used effectively as a material to make a noble metal colloid organosol including single-dispersion noble metal colloid particles at a high concentration, and is preferably used as conductive paste for electronic components and as a pigment for fibers, for example. Other than that, ink, paste and so on, including silver superfine particles at a high concentration and having excellent dispersion stability and good sinterability at low temperaturesr are also available. For example, Nano Metal Ink, which is conductive ink for fine interconnects produced by Vacuum Metallurgical Inc. (which is now called ULVAC Materials, Inc.), and Nano Paste, which is metallic paste for fine interconnects also produced by the same company, are available.

However, none of these dispersions that have been proposed so far considers application onto the surface of a sphere, which is quite different from preferred embodiments of the present invention. For that reason, the present inventors discovered and confirmed via experiments that even if the conventional dispersion was used, the desired silver coating layer could not be formed uniformly on the surface of the core but the silver superfine particles coagulated together or the coating layer partially peeled off (see specific examples of the present invention to be described later).

Based on such results of experiments, the present inventors carried out further researches with the compositions of the dispersion and other parameters changed. As a result, the present inventors discovered that if a film of a dispersion, including a solvent and silver superfine particles at a predetermined ratio, was formed on the surface of the core and then subjected to a prescribed solvent removal process to obtain a desired silver fine particle containing coating layer, the silver superfine particles did not coagulate together but the solvent vaporized uniformly, thereby achieving our objects perfectly. The present inventors acquired the basic idea of the present invention in this manner.

The dispersion for use in this preferred embodiment includes silver superfine particles and a solvent at an appropriately controlled ratio, and therefore, can be adsorbed onto (i.e., can make close contact with) the surface of the sphere just as intended. Besides, the dispersion preferably includes a high-boiling-point solvent with a boiling point higher than about 100° C., and vaporizes slowly. That is why the silver superfine particles can be dispersed with good stability in this dispersion almost without coagulating together.

Furthermore, since the solvent removal process of this preferred embodiment is controlled such that the solvent vaporizes at a constant rate, the dispersion would never be distributed unevenly around the core.

Consequently, according to this preferred embodiment, the surface of the core can be covered with a coating layer including silver superfine particles with good adhesiveness and with a uniform thickness.

Preferred Embodiments

Figure 1:
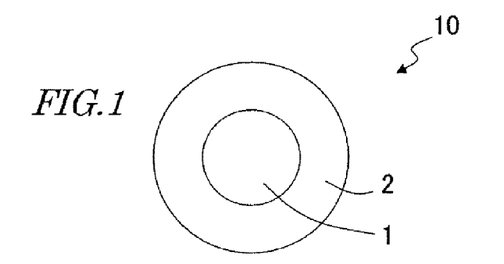
FIG. 1 is a cross-sectional view schematically illustrating a silver-coated ball 10 according to a preferred embodiment of the present invention.

FIG. 1 is a cross-sectional view illustrating a silver-coated ball 10 according to a preferred embodiment of the present invention. As shown in FIG. 1, the silver-coated ball 10 of this preferred embodiment includes a spherical core 1 and a coating layer 2 including silver superfine particles with a mean particle size of 1 nm to 50 nm and surrounding the core 1.

In the silver-coated ball 10 of this preferred embodiment, the surface of the core 1 is covered with silver superfine particles with such a mean particle size. These silver superfine particles have a melting point of about 250° C. to about 300° C., and therefore, can be used to perform a soldering process in a high temperature range. Besides, once melted through heating, the silver never melts again until the temperature reaches its own melting point of about 960° C. Consequently, a semiconductor package, of which the bonding strength with the silver-coated balls is excellent even at high temperatures, is provided.

The silver superfine particles included in the coating layer 2 have a mean particle size of 1 nm to 50 nm. The silver superfine particles may have any mean particle size as long as those particles achieve the performance described above. However, this range is set tentatively in view of the dispersion stability. The silver superfine particles preferably have a mean particle size of 8 nm to 20 nm. Considering possible variations in particle size, the silver superfine particles may have a mean particle size of 8 nm±2 nm to 20 nm±2 nm. The mean particle size was figured out herein by calculating the equivalent area circle diameters of silver particles, falling within the viewing range of 100 nm square, using an image processor and working out the average thereof.

The silver superfine particles do not have to have a monodispersity with a narrow particle size distribution. To form a dense coating layer on the surface of the sphere, the silver superfine particles should rather have a polydispersity in which the particle size distribution has two peaks.

The coating layer 2 may include 0.01 mass % to 1 mass % of C (carbon). Most of C would derive from a solvent for use to make the silver-coated ball of this preferred embodiment. As will be described later, according to this preferred embodiment, the solvent is included at a higher percentage than a normal silver superfine particle containing dispersion in order to have the silver superfine particles make good contact with the surface of the sphere. And the dispersion preferably includes a high boiling point solvent with a boiling point that is higher than about 100° C. That is why a lot of C would be introduced into the coating layer. The content of C is measured by high frequency combustion infrared absorption method that uses a carbon/sulfur analyzer.

The coating layer 2 preferably has a thickness of 0.1 μm to 50 μm. This thickness range is preferred for the following reasons. Specifically, if the thickness of the coating layer 2 were less than 0.1 μm, the coating layer 2 would not function as a solder layer effectively. The coating layer 2 preferably has a thickness of 1.5 μm or more. Nevertheless, if the thickness of the coating layer 2 exceeded 50 μm, then the coating layer might melt and be misaligned after the silver-coated ball has been bonded onto the substrate. The thickness of the coating layer 2 may be figured out by measuring the diameter (i.e., the equivalent area circle diameter) of the ball, of which the surface of the core 1 has already been coated with the coating layer 2, and that of the ball, which has not been coated with the coating layer 2 yet, using a microscope and then calculating the difference between these two diameters.

The differential thermal analysis (DTA) curve of the silver-coated ball 10 preferably has a peak of heat absorption with a maximum value within the range of approximately 100° C. to approximately 200° C. As will be described in detail by way of specific examples later, the DTA curve of the silver-coated ball of this preferred embodiment has not only a peak of heat absorption corresponding to the melting point of silver superfine particles (at about 240° C. to about 250° C) but also another peak of heat absorption that has a maximum value at about 150° C. (see FIG. 8). The latter peak of heat absorption would derive from a high boiling point solvent with a boiling point that is higher than approximately 100° C. for use to prepare the silver-coated ball (e.g., xylene with a boiling point of approximately 140° C. in the specific examples to be described later). It is not yet quite clear exactly how the desired silver coating layer is formed uniformly according to this preferred embodiment. This is probably mainly because by using a dispersion including the high boiling point solvent described above, the solvent would vaporize at an appropriate rate, thus preventing the silver superfine particles from being distributed non-uniformly (or coagulating) on the surface of the core.

As shown in FIG. 1, the coating layer 2 preferably has a single-layer structure including silver superfine particles.

Alternatively, the coating layer 2 may also have a multi-layer structure consisting of a number of metal layers as long as the silver superfine particles can achieve the performance described above. For example, the coating layer 2 may include a first metal layer including silver superfine particles and a second metal layer (plating layer) surrounding the first layer. In such a multilayer structure, the surface of the silver superfine particles is coated with the second layer for plating. That is why even when heated and melted at high temperatures, the silver superfine particles will never be oxidized and lose their own properties. The second metal layer preferably includes a metal such as Sn or In that will melt at a lower temperature than the silver superfine particles.

The core 1 may be anything as long as it is normally used to make a solder ball.

For example, the core 1 may be made of Cu, Al or any other suitable metal and is preferably made of Cu, among other things. This is because Cu has a high melting point, high thermal conductivity and low electrical resistance, and can be used effectively as a connector material for a semiconductor package.

The core 1 may also be made of resin. In that case, to increase the thermal conductivity and form the coating layer 2 more easily, a metal layer of Ni, for example, is preferably deposited on the surface of the core 1 before the coating layer 2 is formed thereon.

The core 1 preferably has a mean particle size of 0.05 mm to 1.5 mm. The mean particle size is appropriately adjusted according to the number of pins of a BGA, for example.

Next, it will be described how to make a silver-coated ball 10 according to this preferred embodiment.

The manufacturing process of this preferred embodiment includes the steps of providing a dispersion including a spherical core, silver superfine particles and a solvent, forming a film of the dispersion on the surface of the core, and removing the solvent of the dispersion from the film of the dispersion, thereby forming a coating layer, including the silver superfine particles, on the surface of the core.

Hereinafter, the respective process steps will be described in detail one by one.

First, a spherical core and dispersion are provided.

The dispersion includes silver superfine particles and a solvent. As will be described later, the dispersion for use in this preferred embodiment has a composition that is qualified to make a desired silver-coated ball.

The dispersion includes 40 mass % to 85 mass % of silver superfine particles and 15 mass % to 60 mass % of solvent, and generally has a higher percentage of solvent than most of dispersions that have ever been proposed. For that reason, a coating layer with a uniform thickness can be formed on the surface of the sphere so as to make close contact with the surface without coagulating the silver superfine particles. If the ratio of the silver superfine particles to the solvent fell outside of the range defined above, then the silver superfine particles could not make good contact with the surface of the core and possibly come off. A preferred content ratio of the silver superfine particles to the solvent would be 50-70 mass % to 30-50 mass %.

Any solvent may be used as long as the solvent can dissolve the silver superfine particles. Both a nonpolar solvent and a polar solvent will do. However, to form a coating layer including silver superfine particles on the surface of the core such that the particles can make good contact with the surface, a nonpolar solvent is preferred. Among other things, a nonpolar hydrocarbon solvent is particularly preferable.

The nonpolar hydrocarbon solvent is typically a paraffin hydrocarbon or an aromatic hydrocarbon. Examples of paraffin hydrocarbons include hexane (with a boiling point of approximately 69° C.), octane (with a boiling point of approximately 126° C.), cyclohexane (with a boiling point of approximately 81° C.) and cyclopentane (with a boiling point of approximately 51° C.). Examples of aromatic hydrocarbons include xylene (with a boiling point of approximately 140° C.), toluene (with a boiling point of approximately 110° C.) and benzene (with a boiling point of approximately 81° C.). Halogenated aromatic hydrocarbons such as chlorobenzene are also included. Any of these hydrocarbons may be used either by itself or in combination. The solvent for use in this preferred embodiment preferably includes xylene at least.

In this preferred embodiment, the solvent preferably includes a solvent with a boiling point that is higher than 100° C. (which will be referred to herein as a "high boiling point solvent") and a solvent with a boiling point that is equal to or lower than 100° C. (which will be referred to herein as a "low boiling point solvent"). Among other things, a high boiling point solvent has an appropriate vaporizing rate that is high enough to form the desired silver superfine particle coating layer, and should be useful. Optionally, the solvent consists essentially of the high boiling point solvent alone.

The dispersion may include not just the silver superfine particles and solvent mentioned above but also other additives (such as a surfactant, an antifoaming agent, and an anticorrosion agent), which are usually included in a silver superfine particle containing dispersion, unless the functions of this preferred embodiment are ruined.

Next, a film of the dispersion is formed on the surface of the core. For the sake of convenience, the ball obtained in this process step will be referred to herein as a "dispersion film coated ball" to be distinguished from the "silver-coated ball", in which the surface of the core is coated with a silver coating layer and which should be eventually obtained by the method of this preferred embodiment.

The film of the dispersion is preferably formed by an immersion process. Specifically, the core is immersed for a predetermined amount of time in a dispersion that has been heated to a temperature of approximately 30° C. The immersion process time can be appropriately controlled according to the composition of the dispersion or any other parameter but is preferably three minutes or less. It should be noted that before immersed in the dispersion, the core is preferably degreased in advance. Then, the dispersion can make better contact with the surface of the core.

In the dispersion film coated ball thus obtained, adjacent cores are bridged together with the dispersion, and therefore, the dispersion is distributed mostly around the cores. If the solvent were vaporized as it is, a lot of silver superfine particles might be left where the dispersion is distributed a lot.

In view of this consideration, according to this preferred embodiment, the solvent is removed from the film of the dispersion in the dispersion film coated ball, thereby forming a coating layer including silver superfine particles on the surface of the core. As a result, a desired silver-coated ball can be obtained.

Figure 2:
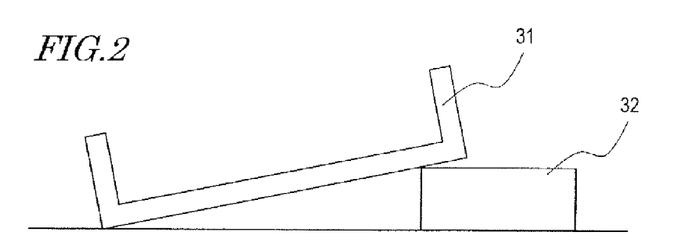
FIG. 2 schematically illustrates a device for making a silver-coated ball from a dispersion film coated ball.

Specifically, the silver-coated ball is preferably made using a device such as that shown in FIG. 2, for example. This device includes a slope 31 to roll the dispersion film coated ball and a base 32 to support the slope.

First, the dispersion film coated ball is put on the slope 31 and the core is rolled on the slope 31. By rolling the dispersion film coated ball along the slope 31 continuously, a dispersion film with a uniform thickness is formed on the surface of the core. As a result, a coating layer including silver superfine particles is deposited to a uniform thickness on the surface of the core. Such a solvent removal function will be further promoted by using a slope of glass, for example. Optionally, the solvent vaporizing rate can be adjusted by changing the angles of the slope 31.

In this preferred embodiment, to obtain a silver coating layer with an even smaller variation in thickness, the solvent is preferably controlled so as to vaporize uniformly. For example, to accelerate the vaporization of the solvent, the excessive solvent on the surface may be absorbed into and removed with a piece of paper (such as a Kimwipe) or cloth before the dispersion film coated ball is put on the slope. Alternatively, the surface of the ball may be dried with a dryer. Optionally, in the process step of rolling the dispersion film coated ball on the slope, the surface of the ball may also be dried with a dryer, for example.

Figure 3:
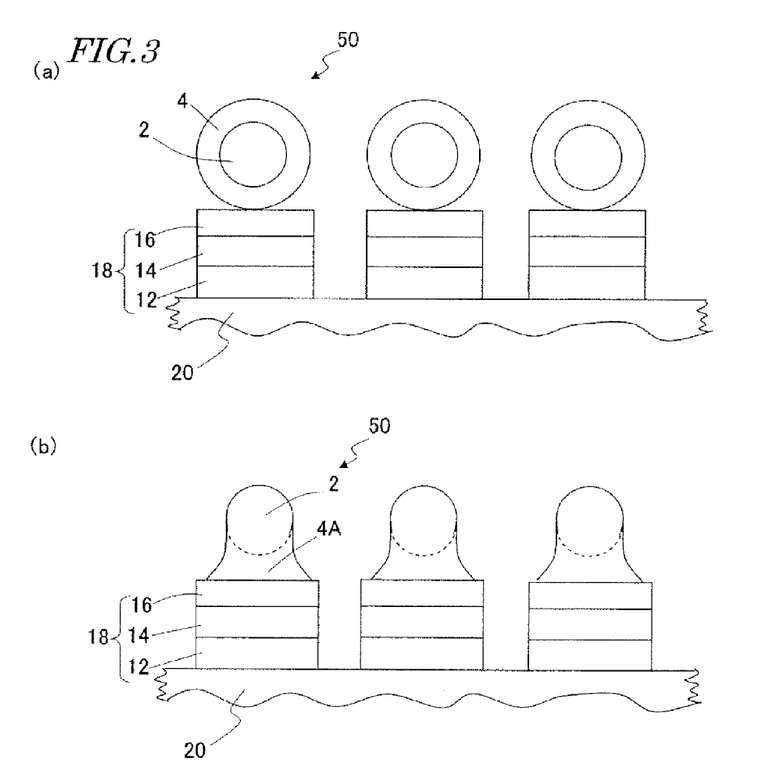
FIGS. 3(a) and 3(b) illustrate an exemplary method of forming a semiconductor interconnect structure according to the present invention.

Hereinafter, a method for forming a semiconductor interconnect structure, including the silver-coated balls of the present invention, will be described with reference to FIG. 3. In the following description, various interconnect structures, in which silver-coated balls may be used for an element or device including a semiconductor chip at least, will be collectively referred to herein as "semiconductor interconnect structures".

First, as shown in FIG. 3(a), silver-coated balls and a desired substrate 20, on which the silver-coated balls 50 will be bonded, are provided. The substrate 20 may be used as an interposer for a BGA (see FIG. 10) or a CSP. On the principal surface of the substrate 20, arranged are pads of conductive materials. Each of these pads 18 may be a stack of a Cu layer 12, a Ni plating layer 14 and an Au plating layer 16, for example. Next, the silver-coated balls 50 on the pads 18 are heated, thereby melting the coating layer 2 as shown in FIG. 3(b), where the molten solder layer is identified by the reference numeral 4A. Then, the molten coating layer 4A is cooled, solidified, and thereby bonded onto the pads 18. By performing these process steps, a semiconductor interconnect structure is formed.

In this semiconductor interconnect structure, the silver-coated balls 50 are bonded to the substrate 20 so strongly that misalignment and other inconveniences are rarely caused. As a result, a highly reliable semiconductor interconnect structure is provided.

EXAMPLES

In the specific examples to be described below, spherical copper cores were used and it was examined how the degree of contact of the silver superfine particles changed according to the composition of the dispersion. Specifically, using two types of copper cores (with diameters of 0.35 mm and 0.75 mm, respectively) and dispersions A and B with the following compositions, silver-coated copper balls representing specific examples #1 and #2 of the present invention and silver-coated copper balls representing comparative examples #1 and #2 were made by the method to be described later.

(Dispersion A)

Dispersion A includes approximately 90 mass % of silver superfine particles (with a mean particle size of about 3 nm to about 15 nm) and approximately 10 mass % of solvent. Dispersion A does not meet the content ratio of silver superfine particles to solvent as defined for the preferred embodiment described above. The solvent consists essentially of xylene and toluene and includes more xylene than toluene.

(Dispersion B)

Dispersion B is prepared by further adding xylene to Dispersion A and includes approximately 60 mass % of silver superfine particles (with a mean particle size of about 3 nm to about 15 nm) and approximately 40 mass % of solvent. Dispersion B satisfies the content ratio of silver superfine particles to solvent as defined for the preferred embodiment described above.

Example 1

First, a copper core with a diameter of 0.75 mm was degreased with a neutral degreaser 506 (produced by Ishihara Chemical Co., Ltd.) as preprocessing. Specifically, the copper core was immersed in the neutral degreaser at 35° C. for approximately five minutes, cleaned with pure water for approximately three minutes at room temperature, and then further cleaned with running water for approximately one minute. Thereafter, the core was immersed in ethanol for approximately two minutes and then dried.

Next, Dispersion B was heated to about 30° C. and the copper core that had been pre-processed as described above was immersed in the dispersion for approximately two minutes. As a result, a dispersion film coated copper ball, in which a film of the dispersion was formed on the surface of the copper core, could be obtained.

After the immersion, the excessive dispersion remaining on the surface of the dispersion film coated copper ball was wiped away with a Kimwipe.

This copper ball was loaded into the device shown in FIG. 2 and put and rolled on a petri dish arranged in the device, thereby making the thickness of the coating layer uniform.

In this manner, a silver-coated copper ball representing a first specific example of the present invention (in which the coating layer of the silver superfine particles had a thickness of approximately 0.4 μm) was obtained.

Example 2

A silver-coated copper ball representing a second specific example of the present invention was made in the same way as in the first specific example described above except that a copper ball with a diameter of 0.35 mm was used instead of the copper ball with a diameter of 0.75 mm. In the silver-coated copper ball of the second specific example, the coating layer of the silver superfine particles had a thickness of approximately 0.7 μm.

Comparative Example 1

A silver-coated copper ball representing a first comparative example was made in the same way as the first specific example described above except that Dispersion A was used instead of Dispersion B.

(Observation of Silver Coating Layer)

Figure 4:
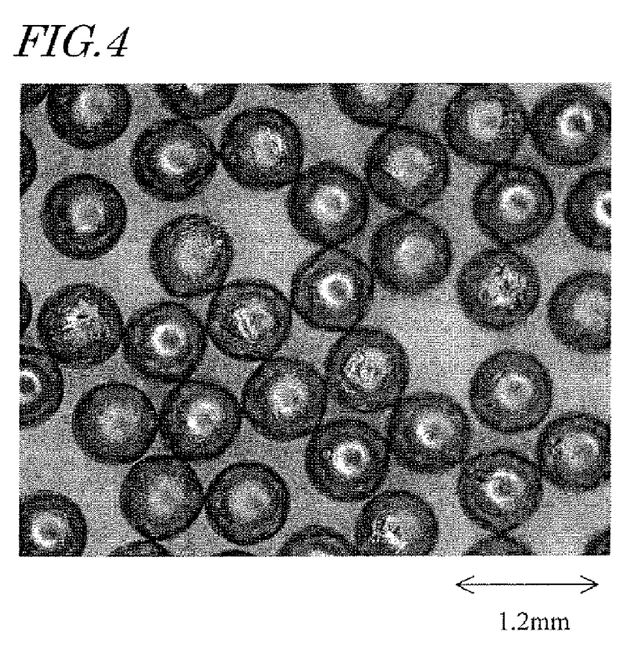
FIG. 4 is a photograph that was shot by observing silver-coated copper balls representing a first specific example of the present invention with a stereoscopic microscope.
Figure 5:
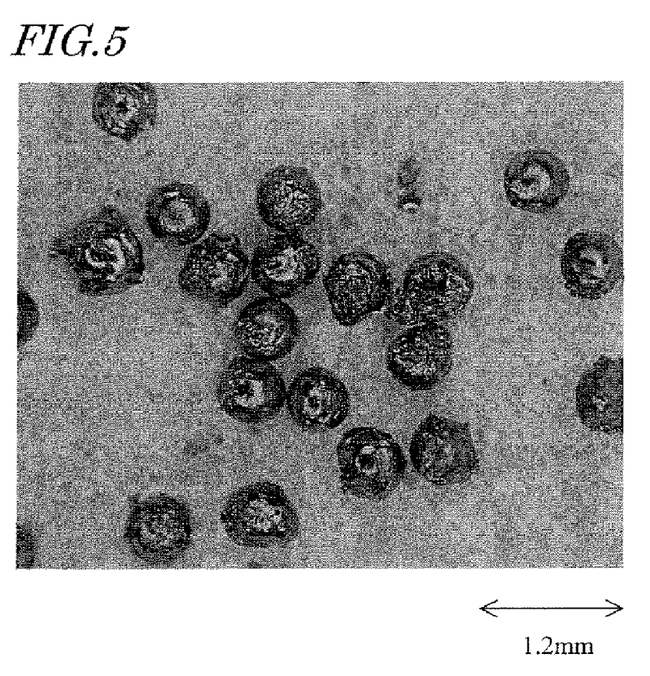
FIG. 5 is a photograph that was shot by observing silver-coated copper balls representing a first comparative example with a stereoscopic microscope.
Figure 6:
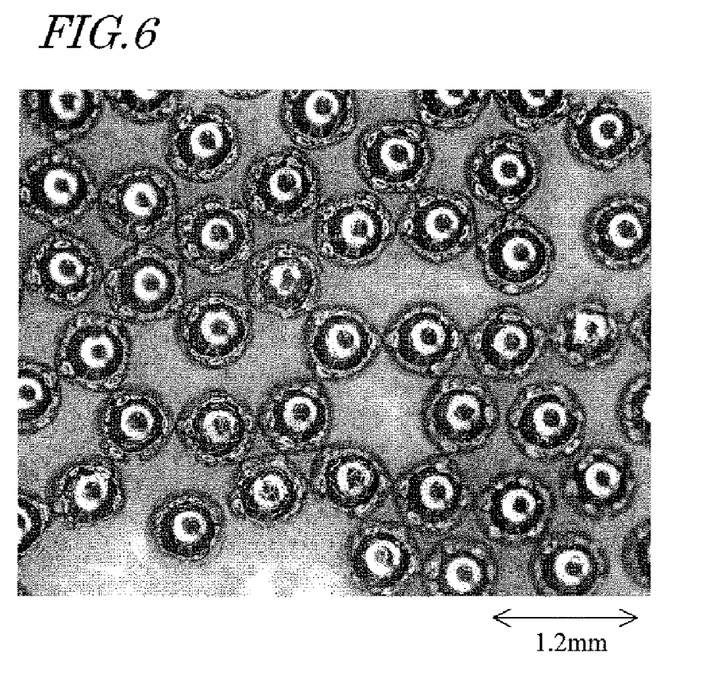
FIG. 6 is a photograph that was shot by observing copper balls with a stereoscopic microscope.

FIGS. 4 and 5 are photographs that were shot by observing silver-coated copper balls representing the first specific example of the present invention and the first comparative example, respectively, with a stereoscopic microscope. FIG. 6 is a micrograph of copper balls, on which the silver coating layer had not been formed yet, just for reference.

As can be seen from FIG. 4, in the silver-coated copper balls of the first specific example that used Dispersion B of the preferred embodiment described above, the silver superfine particles did not coagulate but a coating layer with a uniform thickness was formed on the surface of the copper balls so as to make good contact with the balls.

On the other hand, in the silver-coated copper balls of the first comparative example that were made without using Dispersion B of this preferred embodiment, the silver superfine particles coagulated and no uniform coating layer could be formed as shown in FIG. 5.

Figure 7:
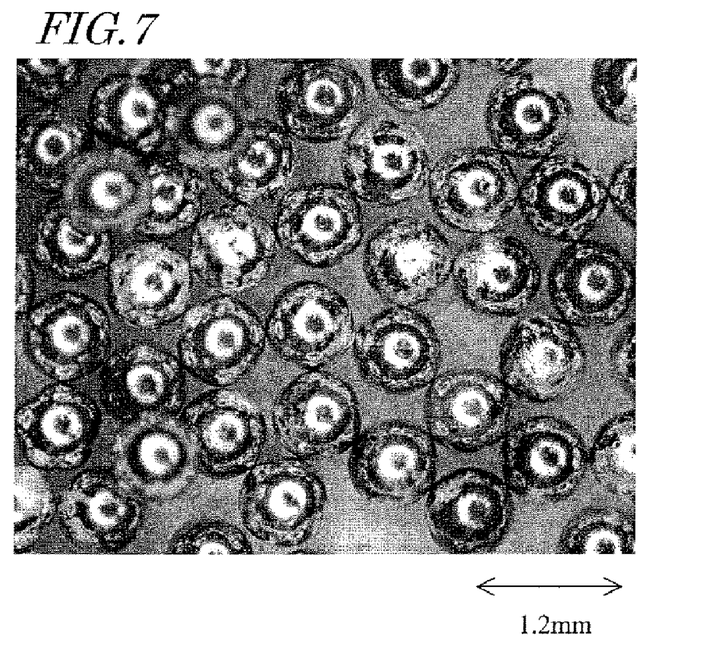
FIG. 7 is a stereoscopic micrograph showing how the silver-coated copper balls of the first specific example looked after having been heated and melted at 300° C. for two hours within a nitrogen atmosphere.

FIG. 7 is a stereoscopic micrograph showing how the silver-coated copper balls of the first specific example looked after having been heated and melted at 300° C. for two hours within a nitrogen atmosphere just for reference. As can be seen from FIG. 7, even after the silver-coated copper balls of the first specific example had been heated and melted at high temperatures, the surface of the copper balls were still covered with those silver superfine particles that still maintained a good degree of contact with the surface. Thus, it can be seen that the silver-coated copper balls of the first specific example can be used effectively as a lead-free solder material for a high-temperature soldering process.

(Analysis on C Content)

The contents of C (carbon) in the silver-coated balls representing the first and second specific examples of the present invention were measured by the high frequency combustion infrared absorption method. The samples under test had a mass of approximately 0.2 g.

For the purpose of comparison, the contents of C in the copper balls (with diameters of 0.75 mm and 0.35 mm, respectively) that were used in the first and second specific examples were also measured in the same way.

The results are shown in the following Table 1, in which the unit mass (g/kpcs) means a unit mass (g) per 1,000 silver-coated balls:

TABLE 1

| Sample under test | | | Unit mass | C content |
|---|---|---|---|---|
| Sample # | Diameter | Coating layer? | (g/kpsc) | (mass %) |
| 1* | 0.75 mm | YES | 0.193 | 0.125 |
| 2 | 0.75 mm | NO | 0.191 | <0.001 |
| 3** | 0.35 mm | YES | 0.020 | 0.172 |
| 4 | 0.35 mm | NO | 0.020 | 0.001 |

*Sample #1 corresponds to silver-coated copper ball of Example #1
**Sample #3 corresponds to silver-coated copper ball of Example #2

Comparing the C contents before and after the silver superfine particle coating layer was formed on the surface of the copper balls (i.e., those of Samples #2 and #1 and those of Samples #4 and #3), it can be seen that the C contents of the silver-coated balls of the first and second specific examples increased due to the formation of the silver coating layer. The C content would have been increased mainly by the solvent that was used to form the silver superfine particle coating layer.

It should be noted that the silver-coated copper balls representing the first comparative example that was made without using Dispersion B of this preferred embodiment had no uniform coating layer and its C content could not be measured.

(DTA Curve)

Figure 8:
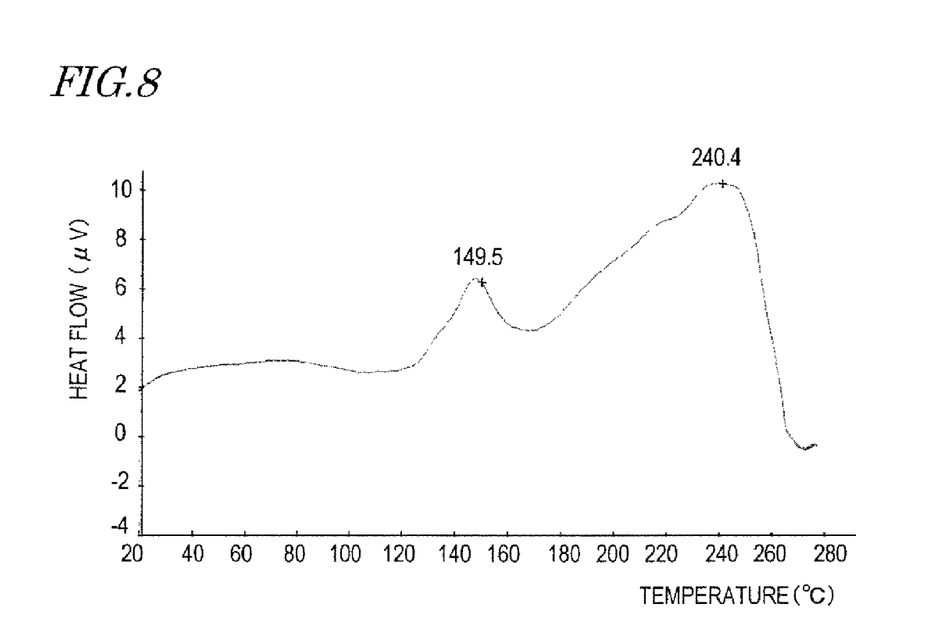
FIG. 8 shows a DTA curve of the silver-coated copper balls of the first specific example.

FIG. 8 shows the DTA curve of the silver-coated copper balls representing the first specific example. Specifically, the DTA curve was plotted when the silver-coated copper balls (25 mg) were heated in the air at a temperature increase rate of 5° C./min. The DTA curve associated with Dispersion A is shown in FIG. 9 for reference.

Figure 9:
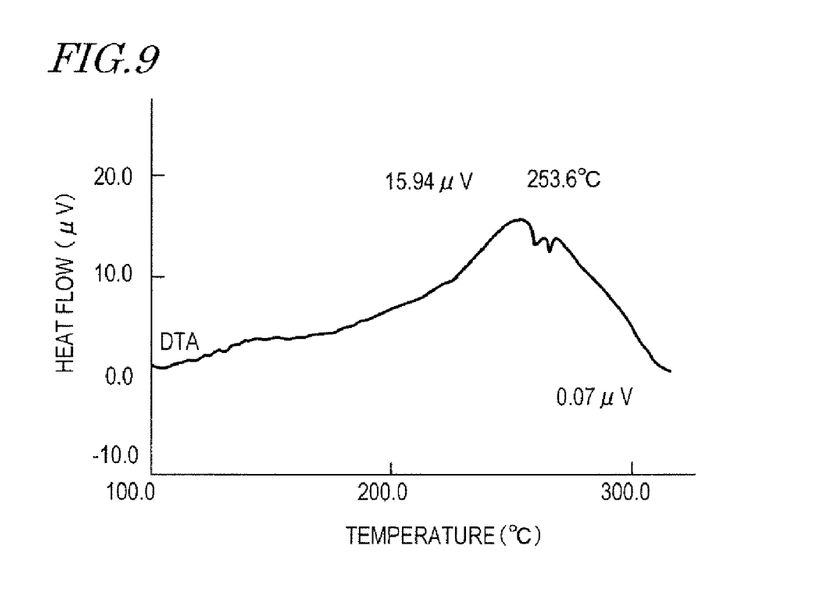
FIG. 9 shows a DTA curve associated with Dispersion A.

As shown in FIG. 9, the DTA curve associated with Dispersion A has a single peak of heat absorption (at 240° C. to 250° C.) corresponding to the melting point (of approximately 260° C.) of silver superfine particles. On the other hand, the DTA curve of the silver-coated balls that were made using Dispersion B had not only that peak of heat absorption but also another peak of heat absorption that has a maximum value at around 150° C. The peak of heat absorption at around 150° C. would mostly derive from xylene (with a boiling point of approximately 140° C.).

INDUSTRIAL APPLICABILITY

The present invention provides a silver-coated ball that contributes to realizing a soldering process in a high temperature range of approximately 250° C. to approximately 300° C. The silver-coated balls of the present invention can be used effectively as input/output terminals for a semiconductor package such as a BGA or a CSP.

The invention claimed is:

1. A silver-coated ball comprising:
   a spherical core; and
   a coating layer including silver superfine particles, the coating layer being arranged so as to surround the core,
   wherein the silver superfine particles included in the coating layer have a mean particle size of 1 nm to 50 nm,
   wherein the silver-coated ball has 0.01 mass % to 1 mass % of carbon in the coating layer, and
   wherein the core has a mean particle size of 0.05 mm to 1.5 mm.

2. The silver-coated ball of claim 1, wherein the coating layer has a thickness of 0.1 μm to 50 μm.

3. The silver-coated ball of claim 1, wherein the core is made of copper or resin.

* * * * *